US007290186B1

(12) United States Patent
Zorian et al.

(10) Patent No.: US 7,290,186 B1
(45) Date of Patent: Oct. 30, 2007

(54) METHOD AND APPARATUS FOR A COMMAND BASED BIST FOR TESTING MEMORIES

(75) Inventors: Yervant Zorian, Santa Clara, CA (US); Gevorg Torjyan, Yerevan (AM); Karen Darbinyan, Fremont, CA (US); Albert Harutyunyan, Yerevan (AM)

(73) Assignee: Virage Logic Corporation, Fremont, CA (US)

( * ) Notice: Subject to any disclaimer, the term of this patent is extended or adjusted under 35 U.S.C. 154(b) by 654 days.

(21) Appl. No.: 10/664,190

(22) Filed: Sep. 16, 2003

(51) Int. Cl.
*G11C 29/00* (2006.01)
*G01R 31/28* (2006.01)
(52) U.S. Cl. ...................................... 714/718; 714/733
(58) Field of Classification Search ................ 714/718, 714/719, 731, 733
See application file for complete search history.

(56) References Cited

U.S. PATENT DOCUMENTS

| | | | |
|---|---|---|---|
| 5,513,318 A | 4/1996 | Van de Goor et al. | |
| 5,570,374 A | 10/1996 | Yau et al. | |
| 5,583,463 A | 12/1996 | Merritt | |
| 5,608,678 A | 3/1997 | Lysinger | |
| 5,960,009 A | 9/1999 | Gizopoulos et al. | |
| 5,978,935 A | 11/1999 | Kim et al. | |
| 5,978,947 A | 11/1999 | Kim et al. | |
| 6,000,051 A * | 12/1999 | Nadeau-Dostie et al. | ... 714/727 |
| 6,067,262 A | 5/2000 | Irrinki et al. | |
| 6,085,334 A * | 7/2000 | Giles et al. | ..................... 714/7 |
| 6,181,614 B1 | 1/2001 | Aipperspach et al. | |
| 6,205,564 B1 | 5/2001 | Kim et al. | |
| 6,237,123 B1 | 5/2001 | Kim et al. | |
| 6,255,836 B1 | 7/2001 | Scharz et al. | |
| 6,304,989 B1 | 10/2001 | Kraus et al. | |
| 6,317,846 B1 | 11/2001 | Higgins et al. | |
| 6,330,696 B1 | 12/2001 | Zorian et al. | |
| 6,396,760 B1 | 5/2002 | Behara et al. | |
| 6,397,349 B2 | 5/2002 | Higgins et al. | |
| 6,408,401 B1 | 6/2002 | Bhavsar et al. | |
| 6,415,344 B1 | 7/2002 | Jones et al. | |
| 6,496,946 B2 | 12/2002 | Bannatyne et al. | |
| 6,510,398 B1 | 1/2003 | Kundu et al. | |

(Continued)

OTHER PUBLICATIONS

Fang et al. "Power-constrained embedded memory BIST architecture", Nov. 3, 2003, IEEE International Symposium on Defect and Fault Tolerance in VLSI Systems, pp. 451-458.*

(Continued)

*Primary Examiner*—James C. Kerveros
(74) *Attorney, Agent, or Firm*—Blakely Sokoloff Taylor & Zafman LLP

(57) ABSTRACT

Methods and apparatuses in which two or more memories share a processor for Built In Self Test algorithms and features are described. The processor initiates a Built In Self Test for the memories. Each memory has an intelligence wrapper bounding that memory. Each intelligence wrapper contains control logic to decode a command from the processor. Each intelligence wrapper contains logic to execute a set of test vectors on a bounded memory. The processor sends a command based self-test to each intelligence wrapper at a first clock speed and the control logic executes the operations associated with that command at a second clock speed asynchronous with the first speed. The processor loads the command containing representations of a march element and data to one or more of the intelligence wrappers via a serial bus.

25 Claims, 6 Drawing Sheets

U.S. PATENT DOCUMENTS

| | | | |
|---|---|---|---|
| 6,519,202 B1 | 2/2003 | Shubat et al. | |
| 6,574,757 B1 | 3/2003 | Park et al. | |
| 6,560,740 B1* | 5/2003 | Zuraski et al. | 714/733 |
| 6,587,979 B1* | 7/2003 | Kraus et al. | 714/720 |
| 6,654,202 B2 | 11/2003 | Phan | |
| 6,691,252 B2 | 2/2004 | Hughes et al. | |
| 6,766,468 B2 | 7/2004 | Barth et al. | |
| 6,769,081 B1* | 7/2004 | Parulkar | 714/733 |
| 6,779,144 B2* | 8/2004 | Hayashi et al. | 714/731 |
| 6,795,942 B1 | 9/2004 | Schwarz | |
| 7,007,211 B1* | 2/2006 | White et al. | 714/718 |
| 7,149,921 B1 | 12/2006 | Zorian et al. | |
| 2004/0006729 A1* | 1/2004 | Pendurkar | 714/733 |

OTHER PUBLICATIONS

Benso et al., "Programmable built-in self-testing of embedded RAM clusters in system-on-chip architectures", Communications Magazine, IEEE, vol. 41, Issue 9, Sep. 2003 pp. 90-97.*

Yervant Zorian: "System-Chip Test Strategies" (Tutorial): DAC 1998: 752-757.

Ilyoung Kim, Yervant Zorian, Goh Komoriya, Hai Pham, Frank P. Higgins, Jim L. Lewandowski: "Built-in Self-Repair for Embedded High Density SRAM." ITC 1998: 1112-1119.

Yervant Zorian, Erik Jan Marinissen, Sujit Dey: "Testing Embedded-Core Based System Chips." ITC 1998: pp. 1-14.

Yervant Zorian, Erik Jan Marinissen, "System Chip Test: How Will It Impact Your Design?", DAC, 2000, pp. 1-6.

Monica Lobetti Bodoni, Alfredo Benso, Silvia Chiusano, Stefano DiCarlo, Giorgio DiNatale, Paolo Prinetto, "An Effective Distributed BIST Architecture for RAMs," pp. 1-6, IEEE European Test Worshop, 2000.

Chauchin Su, Shih-Ching Hsiao, Hau-Zen Zhau, Chung-Len Lee, "A Computer Aided Engineering System for Memory BIST,", DAC, 2001 pp. 1-4.

Yervant Zorian, "Embedding Infrastructure IP for SOC Yield Improvement,", Jun. 2002, 709-712.

Praveen Parvathala, Kalias Maneparambil, William Lindsay, "FRITS—A Microprocessor Functional BIST Method," ITC, Mar. 2002, pp. 590-598.

TechWeb definition, Author Unknown, scan technology, copyright 1981-2001, 1 page.

S. Shoukourian, V. Vardanian, Y. Zorian, "An Approach for Evaluation of Redundancy Analysis Algorithms," The Proceedings of IEEE Int. Workshop on Memory Technology, Design and Testing, 2001.

D.K. Bhavsar, "An Algorithm for Row-Column Self-Repair of RAMs and its Implementation in the Alpha 21264," Proc. ITC'1999, pp. 311-318.

T. Kawagoe, J. Ohtani, M. Niiro, T. Ooishi, M. Hamada, H. Hidaka, "A Built-In Self-Repair Analyzer (CRESTA) for Embedded DRAMs," Proc. ITC'2000, pp. 567-574.

U.S. Appl. No. 10/236,248, filed Sep. 5, 2002, Zorian et al.

Chang, Tsin-Yuan and Zorian, Yervant: "Tutorial 2: SoC Testing and P1500 Standard," Asian Test Symposium 2000: 492.

Marinissen, Erik Jan, et. al.: "Wrapper Design for Embedded Core Test," ITC 2000: 911-920.

Zorian, Yervant and Shoukourian, Samuel: "Embedded-Memory Test and Repair: Infrastructure IP for SoC Yield," IEEE CS and IEEE CASS May-Jun. 2003: 58-66.

Benso, Alfredo, et. al.: "HD2BIST: a Hierarchical Framework for BIST Scheduling, Data Patterns Delivering and Diagnosis in SoCs," ITC 2000: 892-901.

Gizopoulos, Dimitris, et. al.: "Low Power/Energy BIST Scheme for Datapaths," VTS 2000: 23-28.

Vardanian, Valery A. and Zorian, Yervant: "A March-based Fault Location Algorithm for Static Random Access Memories," MDTD 2002: 256-261.

Benso, Alfredo, et. al., "HD-BIST: A Hierarchical Framework for BIST Scheduling and Diagnosis in SoCs," ITC 1999: 1038-1044.

* cited by examiner

| 570 | 572 | 574 |
|---|---|---|
| SA | Adr_dir | N of actions [2:0] |

Figure 5a

| 576 | 578 | 580 | 582 |
|---|---|---|---|
| Element descriptor | Action descriptor1 | Action descriptor.. | Action descriptorN |

Figure 5b

| 584 | 586 |
|---|---|
| CD [1:0] | OD [0:0] |

Figure 5c

| 588 | 590 | 592 | 594 | | |
|---|---|---|---|---|---|
| SA | Adr_dir | N of actions | Action descriptor | CD [ ] | OD [ ] |

Figure 5d

METHOD AND APPARATUS FOR A COMMAND BASED BIST FOR TESTING MEMORIES

NOTICE OF COPYRIGHT

A portion of the disclosure of this patent document contains material that is subject to copyright protection. The copyright owner has no objection to the facsimile reproduction by anyone of the software engine and its modules, as it appears in the Patent and Trademark Office Patent file or records, but otherwise reserves all copyright rights whatsoever.

FIELD OF THE INVENTION

Embodiments of the invention generally relate to self testing of memories. More particularly, an aspect of an embodiment of the invention relates to self testing of memories embedded on a chip.

BACKGROUND OF THE INVENTION

A built-in self-test (BIST) system of memories typically consists of a processor and a number of memories to be tested to find defects. In general during the BIST, the processor applies a set of test vectors to the memory cores. The processor then receives and evaluates the response to the test vectors to determine whether a defect exists in one or more word lines being tested in the memory. The processor may compare the results from the memory output with the predicted values to determine whether a defect exists.

FIG. 1 illustrates a processor sending built-in self-test (BIST) signals to multiple memories. The processor is configured to apply and execute a BIST to various memories, such as memory 1, memory 2, and memory 3. The memories share the built-in self-test features and algorithms of the processor. The processor couples the self-test information via a parallel bus to each memory. A large number of routing paths exist between the processor and each memory, such as twenty-five routing lines in parallel with each memory. The processor connects data lines, address lines, control lines, and march algorithm lines in parallel with each memory.

The information and routing paths pertaining to the self-test of one of the memories could be as follows. Several lines could carry test input data bits. Several lines could carry expected data bits back to the processor. Several lines in parallel to the data lines may carry the march algorithm steps. Several lines may carry the address information on which word line or word lines are to be tested. All of that information from the processor needs to be received by the memory in parallel so that the desired target memory can be vector tested to determine whether a defect exists or not in the memory cells in the memory.

The processor and memories clock cycle may be synchronized such that on each clock cycle the processor provides the necessary data and control information to test an operation on a single address or all of the addresses in a memory under test. An intelligence wrapper surrounds each memory. The processor sends all of the information needed to conduct a march sequence of built-in self-test in parallel on a particular word line to each intelligence wrapper.

This parallel architecture for sending BIST information works fine for a small number of memories that have a large byte capacity. Each memory takes up a large amount of routing paths, such as 25, from the processor. The accumulation of all of the BIST routing paths for all of the memories takes up a lot of space on a system on a chip. However, since there may be only a few large memories on a system of a chip, the cost benefit analysis is fine. However, in a system on a chip design that utilizes a large amount of small memories, such as register files, this many routing paths per memory may not be acceptable.

Another disadvantage of a parallel architecture from the processor to the memories may be that both operate in a synchronous timing cycle. The operations sent from the processor in the parallel lines occur at the clock speed of the memory. Each clock cycle, the processor sends all of the information in parallel needed to conduct a March sequence of the built-in self-test on the memory. Those operations then are executed on the memory at the speed of the memory. Those operations are also evaluated at the speed of the memory. Thus, the built-in self-test processor is generally built to run at the same clock speed as the memories during the built in self-testing. Building a built-in self-test processor that operates at a lower frequency than the memories may be significantly easier.

SUMMARY OF THE INVENTION

Methods and apparatuses in which two or more memories share a processor for Built In Self Test algorithms and features are described. The processor initiates a Built In Self Test for the memories. Each memory has an intelligence wrapper bounding that memory. Each intelligence wrapper contains control logic to decode a command from the processor. Each intelligence wrapper contains logic to execute a set of test vectors on a bounded memory. The processor sends a command based self-test to each intelligence wrapper at a first clock speed and the control logic executes the operations associated with that command at a second clock speed asynchronous with the first speed. The processor loads the command containing representations of a march element and data to one or more of the intelligence wrappers via a serial bus.

BRIEF DESCRIPTION OF THE DRAWINGS

The drawings refer to embodiments of the invention in which:

FIGS. 5a through 5d illustrate embodiments of a structure of the command; and

Figure 1:
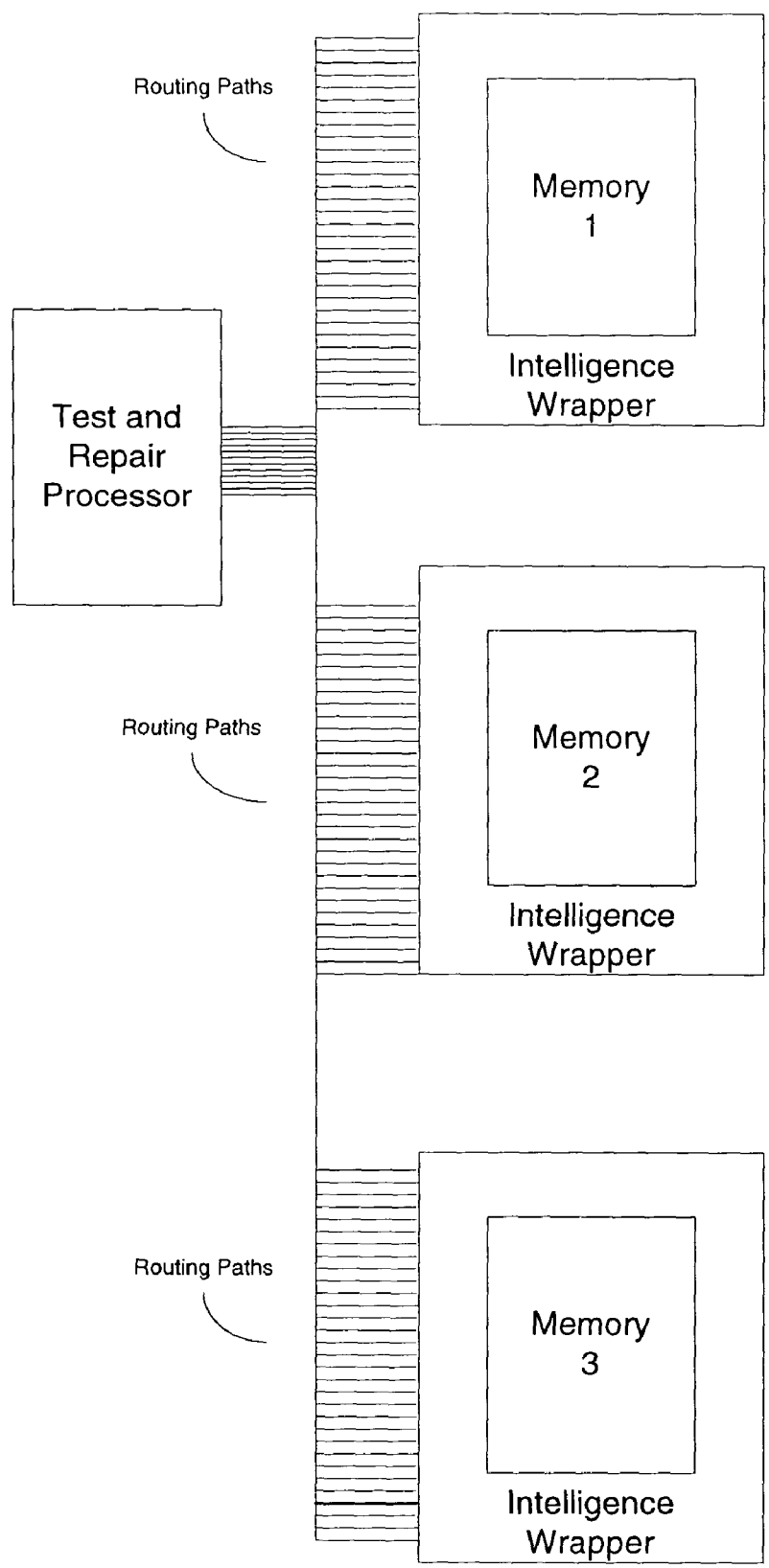
FIG. 1 illustrates a processor sending built-in self-test (BIST) signals to multiple memories.

While the invention is subject to various modifications and alternative forms, specific embodiments thereof have been shown by way of example in the drawings and will herein be described in detail. The invention should be understood to not be limited to the particular forms disclosed, but on the contrary, the intention is to cover all modifications, equivalents, and alternatives falling within the spirit and scope of the invention.

DETAILED DISCUSSION

In the following description, numerous specific details are set forth, such as examples of specific data signals, named components, connections, number of memories, etc., in order to provide a thorough understanding of the present invention. It will be apparent, however, to one of ordinary skill in the art that the present invention may be practiced without these specific details. In other instances, well known components or methods have not been described in detail but rather in a block diagram in order to avoid unnecessarily obscuring the present invention. Further, specific numeric references such as first clock speed, may be made. However, the specific numeric reference should not be interpreted as a literal sequential order but rather interpreted that the first clock speed is different than a second clock speed. Thus, the specific details set forth are merely exemplary. The specific details may be varied from and still be contemplated to be within the spirit and scope of the present invention.

In general, methods and apparatuses in which two or more memories share a processor for Built In Self Test algorithms and features are described. The processor initiates BIST for the memories. Each memory has an intelligence wrapper bounding that memory. Each intelligence wrapper contains control logic to decode a command from the processor. Each intelligence wrapper contains logic to execute a set of test vectors on a bounded memory. The processor sends a command based self-test to each intelligence wrapper at a first clock speed. The control logic in the intelligence wrapper executes the operations associated with that command at a second clock speed asynchronous with the first speed. The processor loads the command containing representations of one or more march elements, data, and other similar information to one or more of the intelligence wrappers via a serial bus. A march algorithm may be composed of a sequence of one or more march elements. In an embodiment, one march element exists per command.

Figure 2:
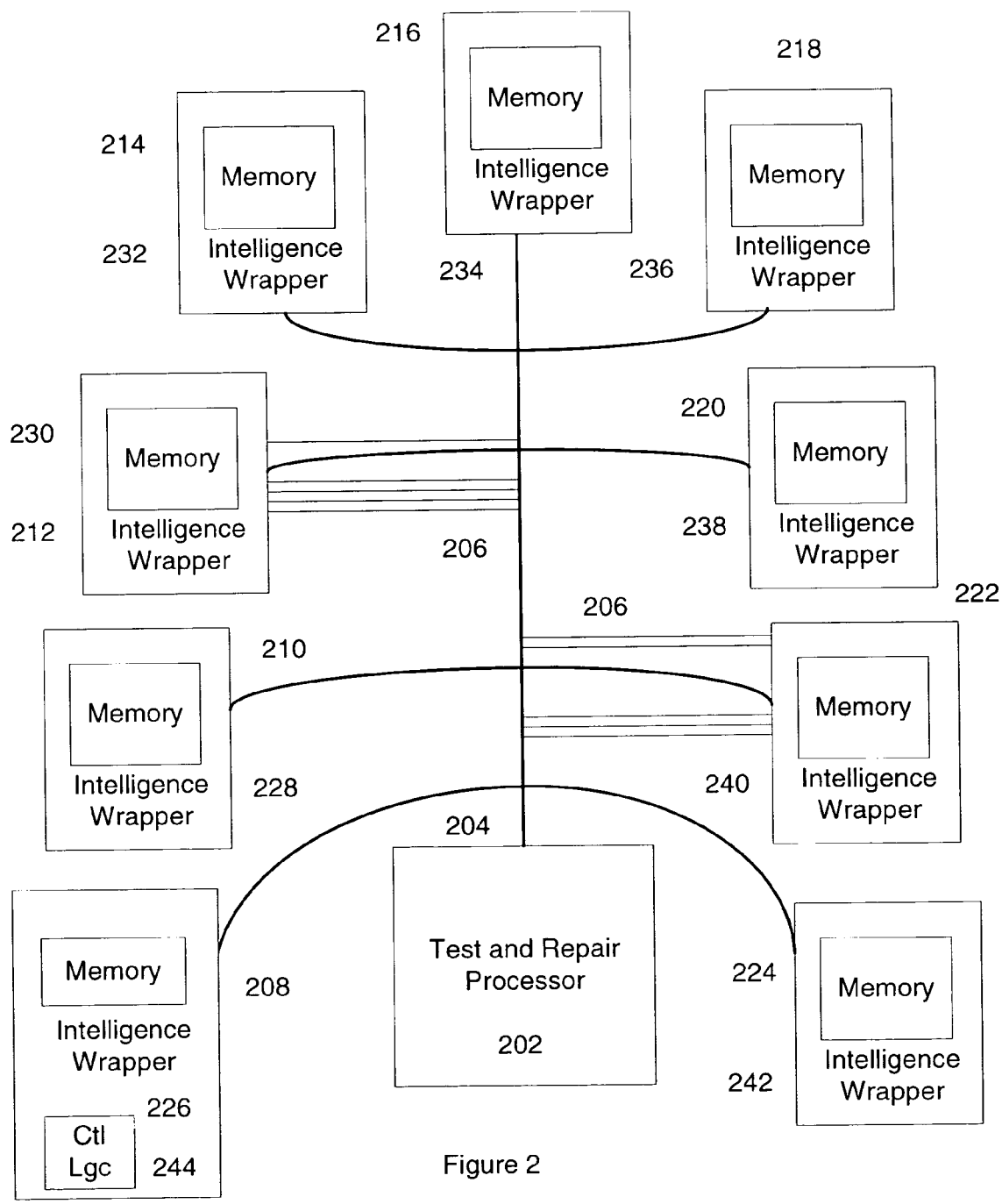
FIG. 2 illustrates an embodiment of a processor issuing command based BIST instructions to two or more memories via a main serial bus.

FIG. 2 illustrates an embodiment of a processor issuing command based BIST instructions to two or more memories via a main serial bus. The processor 202 connects via the main serial bus 204 and with a few parallel control lines 206 with the two or more memories, such as the first memory 208 to the Nth memory 224. Each memory has an intelligence wrapper bounding that memory such as the first intelligence wrapper 226 to the Nth intelligence wrapper 242. The built-in self-test processor 202 initiates a built-in self-test for each of the memories 208-224. The processor 202 loads a command containing representations of one or more march elements, and input data, expected results data, address information, and/or other similar information to each intelligence wrapper 226-242 via the serial bus 204. Note, all of the memories may have control lines, but the shown control lines 206 are limited to the third memory 212 and the eighth memory 222 for ease of understanding. The serial bus 204 and control lines 206 may also be called processor-wrapper nets.

All of the memories 208-224 may share the processor 202 for the built-in self-test features and algorithms. The intelligence wrapper for each memory contains control logic to decode the command from the processor. The intelligence wrapper for each memory contains control logic on how to execute a set of test vectors on the bounded target memory to detect defects in that memory. For example, the first intelligence wrapper 226 contains a first logic 244. The processor 202 loads the command containing representations of the march element, the input data, the expected data, and address information specifying where to apply data to addresses in the memory via the serial interface. The command contains representations of the march element(s), test data, etc. coded in a compressed format. The representations may be the same information but in a compressed format. The control logic expands the representations of the march element(s), the input data, the expected output data, and address information on where to apply data to addresses in the memory to its full-uncompressed form.

The processor may have a few lines routing between the processor 202 and each memory 208-224 and intelligence wrapper 226-242. The routing paths may be the main serial bus 204 with a few parallel routing paths for additional control lines 206. For example, six routing paths for self test purposes may exist between the processor and each bounded memory to be tested. Since all of the data and instructions required to execute a march algorithm for a built-in self-test may load serially via one main serial bus, the number of required routing paths between the processor and each memory can be drastically reduced.

Further, since the processor 202 sends the information via a command serially, the command may be sent to the intelligence wrapper at a first clocking speed, such as 10-30 mega hertz. The control logic in the intelligence wrapper receives the command, decodes the command, and executes operations associated with that command at a second clocking speed such as 600 or 700 mega hertz. The first speed is asynchronous with the second speed meaning that the processes occur at different speeds.

The control logic may be implemented as a state machine configured to decode and execute the set of test vectors coming from the processor 202. The processor 202 sends the commands in a compressed form and the state machine expands the representations of information in the command to their full-uncompressed form. In some prior art, the processor would send all the vector test data in an expanded form across the parallel lines to test the memory.

In the command, a representation of input or expected data may be a cipher, such as a 1 and 0 or a 1 and an A, which can then be looked up in a data table to determine the uncompressed bits and operations that correspond to the compressed information. When the control logic decodes the data representation for that memory, then the data representation may expand out from the two bit cipher to be a sequence of 16 bits of 1's and 0's or 32 bits of 1's and 0's depending upon the width of the word line being tested. Thus, the command may contain input data representations on the data strings to be applied to the memory being tested. The command may also contain expected output data from the memories.

Similarly, the command may include a compressed form, such as ciphers, of march algorithm sequences, address information on the memories to be tested in a compressed form, etc., which can then be decompressed and expanded so that these operations may be carried out by logic within the intelligence wrapper.

March algorithms may be memory operations such as a read operation or a write operation. March algorithms may also indicate whether a single word line address is being tested or all of the word lines in the entire memory are being tested. March algorithms may also indicate whether the entire memory is tested with these read/write operations from the highest address to the lowest address or the lowest address to the highest address. Thus, the command may have representations of the read/write operations to be performed and the sequence of those operations to be performed on the memory. Further, the command may also include address information specifying which memories or word lines are to be tested. The command may also contain other similar information.

The processor 202 serially sends a command to one or more of the memories and the intelligence wrappers surrounding each memory. Logic in the intelligence wrapper may begin to decode each bit in the command as the logic receives each bit. Once the entire command has been received at the logic, then the processor may send an instruction to the intelligence wrapper to execute that command.

Figure 3:
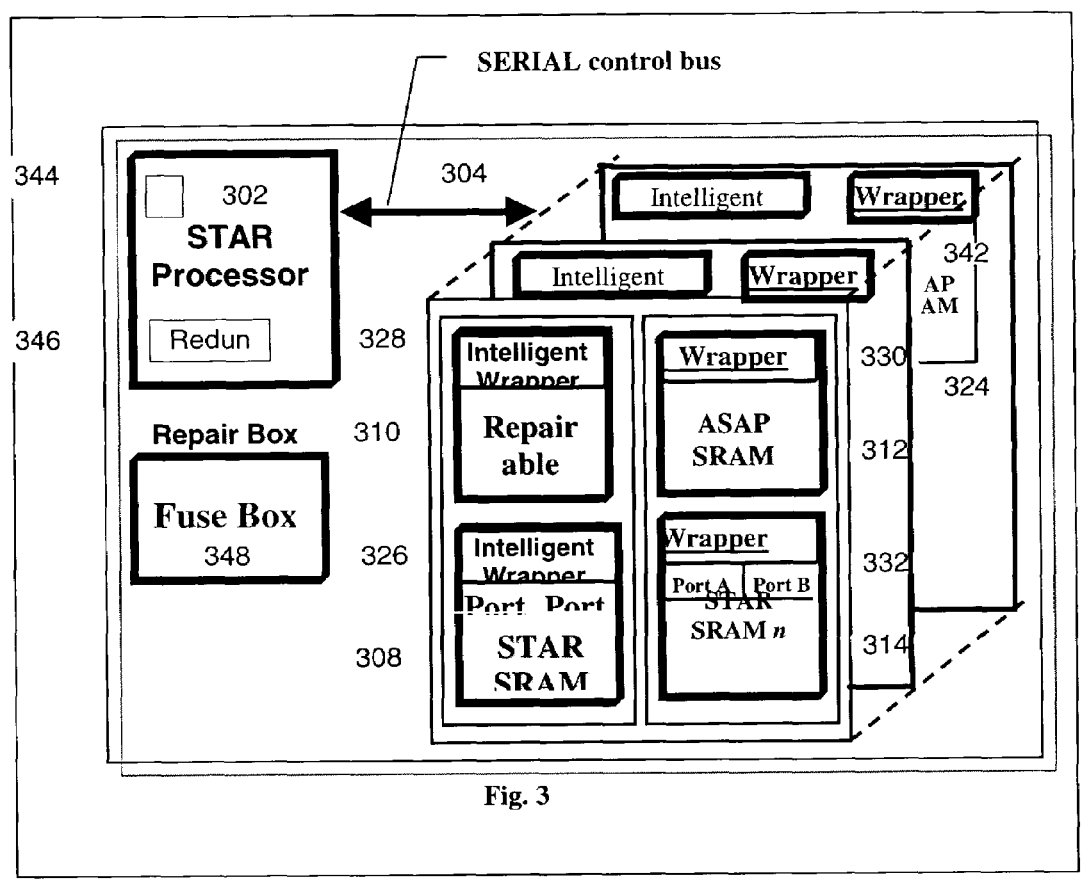
FIG. 3 illustrates an embodiment of a self-test and repair processor having BIST logic encoded in the processor connecting via a serial control bus to multiple memories.

FIG. 3 illustrates an embodiment of a self-test and repair processor having BIST logic encoded in the processor connecting via a serial control bus to multiple memories. The processor and each intelligence wrapper may enable a complete embedded memory self-test and repair function to be included on-chip. The Self-Test-And-Repair (STAR) processor 302 contains logic 344 to determine which self test to apply and sends a command containing a compressed form of that information via a serial interface 304 to each of the intelligence wrappers 326-342. Each memory 308-324 having an intelligence wrapper 326-342 surrounding that memory. Each intelligence wrapper containing logic on how to execute the self test in the command.

The built-in self-test of the memory detects any defects in the memory core and may be conducted asynchronous to the operation of the processor. Redundancy allocation logic 346 contained in the processor 302 may have an algorithm to allocate the one or more redundant components in each memory, such as redundant columns and redundant rows, while fault testing each memory. The repair fuse box 348 stores the repair signature for each memory.

The intelligence wrapper that bounds each memory may contain logic configured specific to the particulars of that memory as well as logic that needs to be conducted at a high clock speed. For example, the size of each memory may be different, such as 512 kilobytes or 256 kilobytes, and each intelligence wrapper may contain its own address counter. Similarly, logic on how to execute the march algorithm on that particular memory may be in the intelligence wrapper. Logic that is common to all of the memories during a self-test may be stored in the shared processor such as logic to determine the type of march algorithm to apply to the memory under test, the shared March algorithm container, and other similar shared logic.

Figure 4:
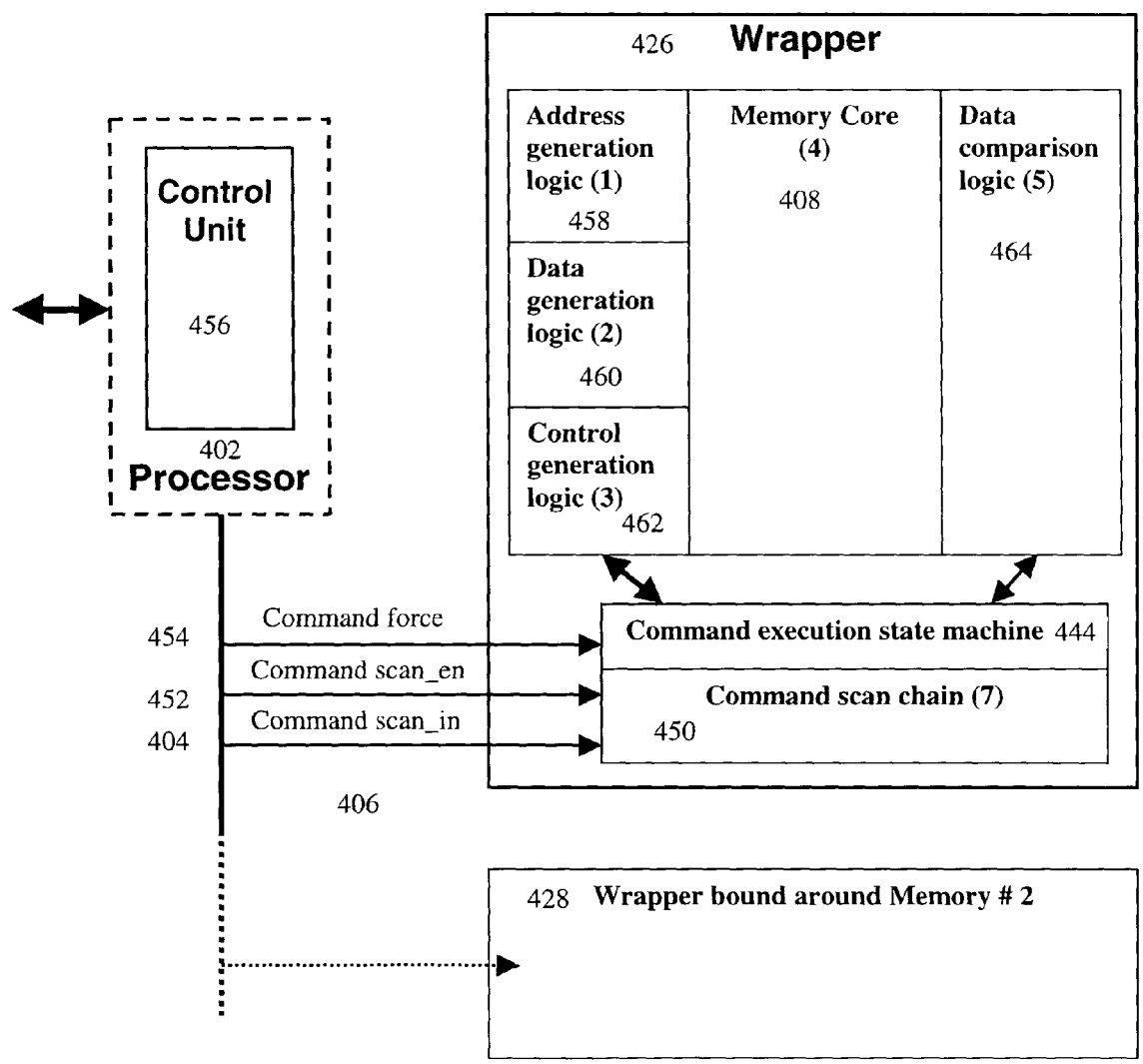
FIG. 4 illustrates an embodiment of a BIST processor connecting via a serial interface to the logic in the intelligence wrapper.

FIG. 4 illustrates an embodiment of a BIST processor connecting via a serial interface to the logic in the intelligence wrapper. Several routing paths 406 exist between the processor 402 and each intelligence wrapper 426, 428. A first routing path 404 may be a command line, such as a scan-in command line, that serially connects the processor 402 to the command scan chain logic 450 to facilitate communicating the command from the processor 402 to the scan chain register 450 in the intelligence wrapper 426. The second routing path 452, such as a command scan en enable line, communicates to that scan chain register 450 when to start receiving bits of the command signal from the processor 402. The third parallel routing path 454 from the processor 402, such as a command force line, communicates to the control logic 444, such as an execution state machine, inside the intelligence wrapper 426 when to expand the built-in self-test information from the command. The logic in the intelligence wrapper may also start decoding bits from the command as soon as those bits are stored in the scan chain register 450. The command force line may also be used to send the execution signal of the command to execute the BIST test on the memory core 408 once all of the bits in the entire command have been sent serially to the scan chain register 450.

The processor 402 may contain logic 456 on determining which algorithms to run for the built-in self-test such the read/write sequences etc., the data vectors, address counting logic, etc. The address counter logic supplies and determines the address in the memory for the next set of tests. The processor 402 may contain logic 456 to compress information used in a self test of the memories embedded on the chip. The processor 402 may contain logic 456 to communicate the compressed information in a serial manner to logic bounding each of the memories.

Logic on how to execute the built-in self-test algorithms may be decoupled from the processor and placed into the intelligence wrapper. The state machine 444 in the intelligence wrapper 426 may be configured on how to carry out the execution of the BIST algorithms received from the processor 402 for that specific memory 408. As discussed, the intelligence wrapper 426 is located very close to the memory core 408 and bound around the memory core 408. Thus, the logic in the intelligence wrapper 426 may operate at a high speed, such as the clock speed of the memory 408, to perform the various BIST test on that memory. The logic in the intelligence wrapper may operate at a clock speed greater than the clock speed of the processor 402.

The processor 402, through the serial interface bus 406 loads the command containing the representations of the march algorithm, data, and address representations into the scan chain register 450 in a serial manner. If twenty bits exist in the command, then after twenty clock cycles the command will be fully loaded into the scan chain register 450. After the initial bit is loaded into the scan chain register 450, the logic within the intelligence wrapper 426 may begin decoding the loaded bits on every clock cycle. After all, for example, twenty bits, load, then the command will be fully loaded into the scan chain register 450. The processor 402 may direct the execution of that command by applying a command force signal through the command force routing path 454 to the state machine 444 in the intelligence wrapper 426. The logic in the intelligence wrapper 426 executes the command from the processor 402, thereby executing the next sequence of the march algorithm on the memory 408.

The intelligence wrapper may contain address generation logic 458, data generation logic 460, control generation logic 462, data comparison logic 464, as well as the command execution state machine 444, the command scan chain register 450, and other similar logic. The address generation logic 458 may generate the X and Y coordinates of the memory word line to be tested. The data generation logic 460 may expand the representation of the data input in the command to generate the sequence of data to be tested for that particular memory 408 and the number of bits needed to test a word length in that memory 408. For example, 16-bit word length, 32-bit word length etc. The data generation logic 460 may receive a representation of the input data such as the cipher 1A. Based off of that 1A representation from the command, the data generation logic 460 may then generate a sequence of 16 1 and 0's to word line being tested. If the cipher were, for example, a 1 and a B, the data generation logic 460 would then generate a different sequence of 1's and 0's for that 16-bit word line being tested. The control generation logic 462 controls the read/write operations on the selected addresses in the memory 408 based upon the march algorithm contained within the command. The control generation logic 462 controls how those read and write operations are performed on the memory 408 and whether it is a specific memory word line being tested or all of the word lines in the memory 408 are being tested. The control generation logic 462 may also control the direction of sequences of operations on the memory 408. The control generation logic 462 may determine whether the memory 408 is being tested from the highest memory address to the lowest memory address, or from the lowest memory address to the highest memory address based upon the march algorithm contained within the command.

Data comparison logic 464 is configured to compare the actual vectors at an output of the bounded target memory 408 with the predicted vector results provided by the command. The data comparison logic 464 may be, for example, an Exclusive Or gate (XOR) series knowing and comparing what the referenced values should to be to what the actual output test data from the memory is.

Sequences of march algorithms may be carried out to perform an entire built-in self-test to detect all of the defects in a memory 408. A march algorithm in the command may instruct the control generation logic 462 to conduct a single operation, such as a read operation, or may instruct the control generation logic 462 to perform several operations back to back such as a read operation, then a write operation, followed by another write operation on a given word line all back to back. Then every word line tested will then perform that series of operations, a read, write, and a write on each word line in that memory 408. The intelligence wrapper 426 does not need to wait to receive another serially fed command to perform those three operations in rapid succession.

As discussed, the processor 402 may operate asynchronously from the clock of the memory 408 and thus be able to run at a lower frequency than the memory, which may be much easier to design. The commands from the processor may be executed by the logic in the intelligence wrapper 426 at the higher frequency memory speed and transferred serially from the processor 402 at the bus speed. Because the logic in the intelligence wrapper 426 may run at a higher speed than a prior parallel architecture coming across the bus, the BIST test run may take nearly the same time or even less time then some prior techniques.

The processor 402 may connect to greater amount of memories 426, 428 using a command based BIST architecture because a fewer number of routing lines 406 need to exist between each memory and the processor. The BIST resources on a system on a chip take up less space then some prior techniques because a greater amount of memories may be connected per processor and fewer routing paths are needed.

FIGS. 5a through 5d illustrate embodiments of a structure of the command. A command may be an accumulation of various blocks of interrelated information. Referring to FIGS. 5a-5c, a structure of the command may have blocks of interrelated information such as a SA block 570 indicating whether the march algorithm must be executed on a single memory address, or through the entire memory space from the highest memory address to the lowest memory address in that memory or vice versa. The next block of information in that command could be an address direction block 572 indicating whether the address is going to be incrementing/counting up in memories or decrementing down in memories during the march algorithm execution. The next block of information may be a number of actions (i.e. operations) block 574 such as a read operation, another read operation etc. This number of actions block 574 could indicate that a single operation is to occur or point to another block of information stored in the code of the logic in the intelligence wrapper, such as Element descriptor block 576 for execution of multiple back to back operations. The element descriptor block 576 may alternatively be transmitted via the command. Operations, for example, may be a read operation, a write operation, or a read/write operation or similar operation.

Referring to FIG. 5b, the element descriptor block 576 may be tied a number of actions to be performed on the memory. For example, the first action descriptor block 578 may list an initial operation to be performed on the memory such as a read operation, the second action descriptor block 580 may list the next operation to be performed on the memory such as a write operation. The Nth action descriptor block 582 may list the final back to back operation to be performed on the memory.

Each action descriptor block 578-582 may point to the data descriptor blocks 584, 586 of information shown in FIG. 5c. The data descriptor block 584 may provide the input data for that operation. The data descriptor block 586 may provide the expected output data for that operation based upon the input test vectors. Thus, an action description block may contain a field such as CD that contains the data pattern, which the logic uses during that particular read/write operation. The entire BIST test may be composed of thousands of commands.

Alternatively, a structure of a command does not need to be a loose conglomeration of blocks of information related to each another. Referring to FIG. 5d, the structure of the command may be a series of bits and the position of a bit within that string of sequential bits associates that bit with particular section of information. A command may be such that, for example, the initial N number of bits 588 in the command represent the addresses of the memory being tested and the direction of that march algorithm, the next N number of bits 590 represent the number and type of operations to be performed, the next N number of bits 592 represent in the command may correspond to the input data representation that will be used, the next sequential N number of bits 594 represent may be the expected data results, etc.

Figure 6:
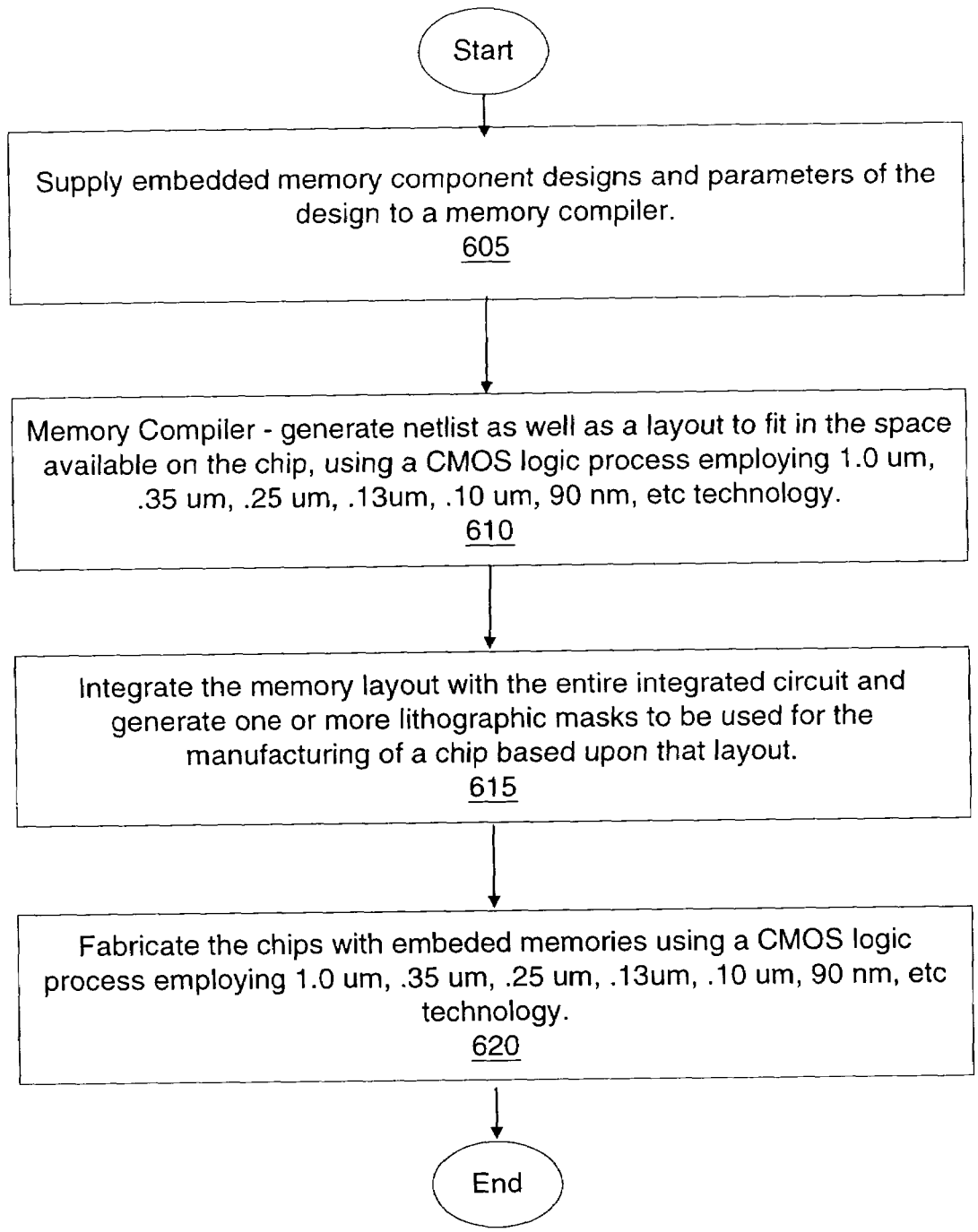
FIG. 6 illustrates an example process of generating an embedded memory from designs of memory components with an embodiment of a memory compiler.

FIG. 6 illustrates an example process of generating an embedded memory from designs of memory components with an embodiment of a memory compiler.

In block 605, the designs for each processor and memory component for the embedded memory are supplied to the memory compiler, as well as other design parameters such as the number of columns and number of rows of the array, the available size on the chip and other parameters. Thus, the designs for one or more memories that share a processor for Built In Self Test may be supplied to the memory compiler. A memory compiler may be a software program comprised of multiple algorithms and designs for the purpose of generating a circuit design and a layout in a space available on a target chip. The set of application-specific algorithms and interfaces of the memory compiler may be used by system IC integrators to rapidly create hundreds of silicon-proven memory cores. The memory compiler receives the memory component designs and utilizes those memory component designs in conjunction with memory circuit designs to optimize a circuit design and layout in the space available on a target chip.

In block 610, the memory compiler generates a netlist and a layout targeted to fit in the space available on a target chip. The memory compiler stores the data representing the embedded memory typically on a machine-readable medium. The memory compiler selects the memory component building blocks so that they are sized appropriate for the targeted fabrication technology. The memory compiler then provides the memory layout to be used to generate one or more lithographic masks to be used in the fabrication of that embedded memory. The memory compiler also provides a netlist for verification of the embedded memory.

In block 615, the memory layout generated is integrated with the rest of the layout for the chip and a machine generates the lithographic masks that contain the information necessary for the fabrication of a functional device. The machine generates one or more lithographic masks to be used to transfer that circuit design onto the chip. The memory solution for embedded applications integrates easily with the standard single poly CMOS processes.

In block 620, a fabrication facility fabricates the chips with the embedded memories using the lithographic masks generated from the memory compiler's circuit design and layout. Fabrication facilities may use a standard CMOS logic process having minimum line widths such as 1.0 um, 0.50 um, 0.35 um, 0.25 um, 0.18 um, 0.13 um, 0.10 um, 90 nm, or less, to fabricate the chips. The size of the CMOS logic process employed typically defines the smallest minimum lithographic dimension that can be fabricated on the chip using the lithographic masks, which in turn determines minimum component size. In an embodiment, light is shown through these lithographic masks onto the chip to transfer the circuit design and layout for the embedded memory onto the chip itself. In an embodiment, the memory compiler is designed for embedded applications in the standard CMOS logic process.

In one embodiment, the software used to facilitate the memory compiler can be embodied onto a machine-readable medium. A machine-readable medium includes any mechanism that provides (e.g., stores and/or transmits) information in a form readable by a machine (e.g., a computer). For example, a machine-readable medium includes read only memory (ROM); random access memory (RAM); magnetic disk storage media; optical storage media; flash memory devices; DVD's, electrical, optical, acoustical or other form of propagated signals (e.g., carrier waves, infrared signals, digital signals, EPROMs, EEPROMs, FLASH, magnetic or optical cards, or any type of media suitable for storing electronic instructions. Slower mediums could be cached to a faster, more practical, medium.

In an embodiment, an example memory compiler may comprise the following. A graphic user interface, a common set of processing elements, and a library of files containing design elements such as circuits, control logic, and cell arrays that define the complier. In an embodiment, object code in a set of executable software programs.

As noted, in an embodiment, a designer chooses the specifics of the memory configuration to produce a set of files defining the requested memory instances. A memory instance may include front end views and back end files. The front end views support documentation, simulation, debugging, and testing. The back end files, such as a layout, physical LEF, etc are for layout and fabrication.

The memory compiler outputs may include Behavioral Models and Test Benches (Verilog, VHDL), •Timing Models (TLF, .Lib and STAMP), Test Models (MemBIST, FastScan), Structural Netlists (EDIF, Spice), Power Models (WattWatcher, ALF), Floorplanning and Place&Route Models, Physical LEF, FRAM, Layout (GDS), Datasheets (including power, timing, and area specifications, as well as other outputs. When programming occurs or if a revision is needed, the designer merely has to redesign the block, a few metal and via masks.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussions, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers, or other such information storage, transmission or display devices.

What is claimed is:

1. An apparatus, comprising:
   two or more memories, wherein each memory has an intelligence wrapper bounding the memory;
   a processor to initiate a Built in Self Test for the memories; and
   a serial bus coupled between the processor and each memory; wherein the processor loads a plurality of commands via the serial bus into a first one of the intelligence wrappers, wherein each of the commands comprises representations of a single march element and other data and wherein the first intelligence wrapper contains control logic to decode the command from the processor and to execute a set of test vectors of a march algorithm having a plurality of march elements, on a bounded memory.

2. The apparatus of claim 1, wherein the command containing representations of the march element and data is coded in a compressed format and the first intelligence wrapper comprises control logic that is configured to expand the representation of the march element and the data.

3. The apparatus of claim 2, wherein the control logic comprises a state machine configured to decode the command and to execute a set of test vectors.

4. The apparatus of claim 1, wherein a state machine expands the representations of the march element and data in the command to their full-uncompressed form.

5. The apparatus of claim 4, wherein the representation comprises a cipher that is looked up in a data table of the first intelligence wrapper to determine the uncompressed bits and operations that correspond to the compressed information.

6. The apparatus of claim 1, wherein the two or more memories share the processor.

7. The apparatus of claim 1, wherein logic contained in the intelligence wrapper operates at a clock speed asynchronous to a clock speed of the processor.

8. The apparatus of claim 1, wherein the command further comprises:
input data, expected output data, and address information on where to apply data to addresses in the memories.

9. The apparatus of claim 1, wherein a structure of the command comprises various blocks of interrelated information.

10. The apparatus of claim 1, wherein a structure of the command comprises a series of bits and a position of a bit within the series of bits associates that bit with a particular section of information wherein the command includes a section representing the memory address being tested, a section representing the direction of a march algorithm, a section representing the number and type of test operations to be performed, and a section representing expected test data.

11. An apparatus, comprising:
two or more memories, each memory has an intelligence wrapper bounding the memory;
a serial bus; and
a processor to initiate a Built In Self Test for the memories via the serial bus, wherein a first intelligence wrapper contains control logic to decode a compressed command from the processor and to execute a set of test vectors on a bounded memory, wherein the processor sends a command based self test to the first intelligence wrapper at a first speed and the control logic executes the operations associated with the command at a second speed asynchronous with the first speed, and wherein the processor loads a plurality of commands via the serial bus into the first intelligence wrapper, wherein each of the commands comprises representations of a single march element and other data and wherein the first intelligence wrapper contains control logic to decode the command from the processor and to execute a set of test vectors of a march algorithm having a plurality of march elements, on the bounded memory.

12. The apparatus of claim 11, wherein logic in the intelligence wrapper operates at a clock speed greater than the clock speed of the processor.

13. The apparatus of claim 11, wherein logic in the intelligence wrapper further comprises data comparison logic configured to compare actual vectors at an output of a first bounded memory.

14. The apparatus of claim 11, wherein logic in the intelligence wrapper further comprises address generation logic to generate coordinates of a memory word line to be tested.

15. The apparatus of claim 11, wherein the logic in the intelligence wrapper further comprises data generation logic to expand a representation of data input from the processor to generate a sequence of data to be tested for the memory.

16. The apparatus of claim 11, wherein logic in the intelligence wrapper further comprises a state machine configured to decompress the command sent from the processor.

17. The apparatus of claim 11, wherein a march element in the command may instruct logic in the intelligence wrapper to conduct two or more operations back to back.

18. The apparatus of claim 1, wherein less than seven routing paths for self test purposes exist between the processor and the bounded memory.

19. A machine readable medium that stores data representing an integrated circuit, comprising:
two or more memories, each memory has an intelligence wrapper bounding the memory;
a serial bus; and
a processor to initiate a Built In Self Test for the memories via the serial bus, wherein a first intelligence wrapper contains control logic to decode a compressed command from the processor and to execute a set of test vectors on a bounded memory, wherein the processor sends a command based self test to the first intelligence wrapper at a first speed and the control logic executes the operations associated with the command at a second speed asynchronous with the first speed, and wherein the processor loads a plurality of commands via the serial bus into the first intelligence wrapper, wherein each of the commands comprises representations of a single march element and other data and wherein the first intelligence wrapper contains control logic to decode the command from the processor and to execute a set of test vectors of a march algorithm having a plurality of march elements, based on the single march element within the command, on the bounded memory.

20. The machine-readable medium of claim 19, wherein the machine-readable medium comprises a memory compiler to provide a layout utilized to generate one or more lithographic masks used in the fabrication of the memories and the processor.

21. The machine readable medium of claim 20, wherein less than seven routing paths for self test purposes exist between the processor and the bounded memory.

22. A method, comprising:
compressing information, to be used in a self test of a memory embedded on a chip, into a command, wherein there is a march algorithm representation in said command;
communicating the command via a serial bus to logic bounding the memory; and
receiving the communicated command and expanding the compressed information by the logic bounding the memory, to perform a march algorithm as part of the self-test on the memory.

23. The method of claim 22, further comprising:
performing operations of the self-test asynchronously with the communication of the compressed information.

24. An apparatus, comprising:
means for compressing information, to be used in a self test of a memory embedded on a chip, into a command, wherein there is a march algorithm representation in said command;
means for communicating the command via a serial bus to logic bounding the memory; and
means for receiving the communicated command and expanding the compressed information by the logic bounding the memory, to perform a march algorithm as part of the self-test on the memory.

25. The apparatus of claim 24, further comprising:
means for performing operations of the self-test asynchronously with the communication of the compressed information.

* * * * *